US006982180B2

(12) United States Patent
Hishida

(10) Patent No.: US 6,982,180 B2
(45) Date of Patent: Jan. 3, 2006

(54) ELECTROLUMINESCENT DISPLAY DEVICE MANUFACTURING METHOD

(75) Inventor: Mitsuoki Hishida, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 36 days.

(21) Appl. No.: 10/401,043

(22) Filed: Mar. 28, 2003

(65) Prior Publication Data

US 2004/0029483 A1 Feb. 12, 2004

(30) Foreign Application Priority Data

Mar. 28, 2002 (JP) ............................ 2002-092057

(51) Int. Cl.
*H01L 21/00* (2006.01)

(52) U.S. Cl. ............................ 438/22; 438/25; 438/30; 438/82; 438/155

(58) Field of Classification Search .................. 438/22, 438/25, 30, 82, 149, 155
See application file for complete search history.

(56) References Cited

U.S. PATENT DOCUMENTS 6,321,522 B1 * 11/2001 Landolt et al. ............... 57/414
6,593,691 B2 * 7/2003 Nishi et al. ................. 313/506

FOREIGN PATENT DOCUMENTS

EP 1 154 398 A2 11/2001

* cited by examiner

*Primary Examiner*—Hsien-Ming Lee
(74) *Attorney, Agent, or Firm*—Morrison & Foerster LLP

(57) ABSTRACT

A step of forming graphical symbols in an electroluminescent display device is performed by applying laser beams to a metal layer that is formed as a part of internal component formation of the display device. Powdery substances generated during the graphical symbol formation do not reach the internal components of the display device because they are sealed at the time of the graphical symbol formation.

6 Claims, 5 Drawing Sheets

ELECTROLUMINESCENT DISPLAY DEVICE MANUFACTURING METHOD

BACKGROUND OF THE INVENTION

1. Field of the Invention

This invention relates to an electroluminescent display device manufacturing method, particularly to an electroluminescent display device manufacturing method including a step of forming letters or symbols on a device substrate by applying laser beams.

2. Description of the Related Art

In recent years, electroluminescent (hereafter, referred to as EL) display devices with EL elements have been receiving an attention as a display device substituting for a CRT and an LCD.

Hereafter, there is described an example of a structure of a pixel of an organic EL display device.

FIG. 6 is a plane view showing a pixel of an organic EL display device. FIG. 7A is a cross-sectional view along A—A line of FIG. 6 and FIG. 7B is a cross-sectional view along B—B line of FIG. 6.

As shown in FIG. 6, and FIGS. 7A and 7B, a pixel 115 is formed in a region enclosed with a gate signal line 51 and a drain signal line 52. A plurality of the pixels 115 are disposed in a matrix.

There are disposed in the pixel 115 an organic EL element 60 as a self-emission device, a switching TFT (thin film transistor) 30 for controlling a timing of supplying an electric current to the organic EL element 60, a driving TFT 40 for supplying an electric current to the organic EL element 60 and a storage capacitor. The organic EL element 60 is formed of an anode 61, an emissive made of an emission material, and a cathode 63.

The switching TFT 30 is provided in a periphery of a point of intersection of the both signal lines 51 and 52. A source 33*s* of the switching TFT 30 serves as a capacitor electrode 55 for forming a capacitor with a storage capacitor electrode line 54 and is connected to a gate electrode 41 of the driving TFT 40. A source 43*s* of the driving TFT 40 is connected to the anode 61 of the organic EL element 60, while a drain 43*d* is connected to a driving source line 53 as a current source to be supplied to the organic EL element 60.

The storage capacitor electrode line 54 is disposed in parallel with the gate signal line 51. The storage capacitor electrode line 54 is made of Cr (chromium) or the like and forms a capacitor by storing an electric charge with the capacitor electrode 55 connected to the source 33*s* of the TFT through a gate insulating film 12. A storage capacitor 56 is provided for storing voltage applied to the gate electrode 41 of the driving TFT 40.

As shown in FIGS. 7A and 7B, the organic EL display device is formed by laminating the TFTs and the organic EL element sequentially on a substrate 10 such as a substrate made of a glass or a synthetic resin, a conductive substrate, or a semiconductor substrate. When using a conductive substrate or a semiconductor substrate as the substrate 10, however, an insulating film such as $SiO_2$ or $SiN_x$ is formed on the substrate 10, and then the switching TFT 30, the driving TFT 40 and the organic EL element 60 are formed thereon. Each of the two TFTs has a so-called top gate structure in which a gate electrode is disposed above an active layer with a gate insulating film being interposed therebetween.

There will be described the switching TFT 30 first. As shown in FIG. 7A, an amorphous silicon film (hereafter, referred to as an a-Si film) is formed on the insulating substrate 10 made of a silica glass, a non-alkali glass or the like by a CVD method etc. The a-Si film is irradiated with laser beams for melting and recrystalizing to form a poly-silicon film (hereafter, referred to as a p-Si film) as an active layer 33. On the active layer 33, a single-layer or a multi-layer of an $SiO_2$ film and an $SiN_x$ film is formed as the gate insulating film 12. There are disposed on the gate insulating film 12 the gate signal line 51 made of metal having a high melting point such as Cr and Mo (molybdenum) and also serving as a gate electrode 31, the drain signal line 52 made of Al (aluminum), and the driving source line 53 made of Al and serving as a driving source of the organic EL element.

An interlayer insulating film 15 laminated with an $SiO_2$ film, an $SiN_x$ film and an $SiO_2$ film sequentially is formed on whole surfaces of the gate insulating film 12 and the active layer 33. There is provided a drain electrode 36 by filling metal such as Al in a contact hole provided correspondingly to a drain 33*d*. Furthermore, a planarization insulation film 17 for planarizing a surface which is made of organic resin is formed on the whole surface.

Next, there will be described the driving TFT 40 of the organic EL element. As shown in FIG. 7B, an active layer 43 formed by poly-crystalizing an a-Si film by applying laser beams thereto, the gate insulating film 12, and the gate electrode 41 made of metal having a high melting point such as Cr or Mo are formed sequentially on the insulating substrate 10 made of a silica glass, a non-alkali glass or the like. There are provided in the active layer 43 a channel 43*c*, and a source 43*s* and a drain 43*d* on both sides of the channel 43*c*.

The interlayer insulating film 15 laminated with an $SiO_2$ film, an $SiN_x$ film and an $SiO_2$ film sequentially is formed on the whole surface of the gate insulating film 12 and the active layer 43. There is disposed the driving source line 53 connected to a driving source by filling metal such as Al in a contact hole provided correspondingly to a drain 43*d*. Furthermore, a planarization insulation film 17 for planarizing the surface, which is made of, for example, an organic resin is formed on a whole surface.

A contact hole is formed in a position corresponding to a source 43*s* in the planarization insulation film 17. There is formed on the planarization insulation film 17 a transparent electrode made of ITO (indium tin oxide) and contacting to the source 43*s* through the contact hole, i.e., the anode 61 of the organic EL element. The anode 61 is formed in each of the pixels, being isolated as an island.

The organic EL element 60 includes the anode 61 made of a transparent electrode such as ITO, a first hole transport layer made of MTDATA (4,4-bis (3-methylphenylphenylamino) biphenyl), a hole transport layer 62 made of a second hole transport layer made of TPD (4,4,4-tris (3-methylphenylphenylamino) triphenylanine), an emissive 63 made of $Bebq_2$ (bis(10-hydroxybenzo[h]quinolinato)beryllium) containing a quinacridone derivative, an electron transport layer 64 made of $Bebq_2$, and a cathode 65 made of magnesium-indium alloy, aluminum or aluminum alloy.

In the organic EL element 60, a hole injected from the anode 61 and an electron injected from the cathode 65 are recombined in the emissive and an exciton is formed by exciting an organic module forming the emissive 63. Light is emitted from the emissive 63 in a process of relaxation of the exciton and then released outside after going through the transparent anode 61 and the transparent insulating substrate 10.

In the organic EL display device having the above-described structure, for example, as shown in FIG. 8, a plurality of organic EL display units 201 are formed in a matrix at predetermined intervals on a glass substrate 200 called a mother glass. In the example of FIG. 8, four by four pieces of the organic EL display units 201 are formed. There is formed adjacent each of the organic EL display units 201, a numbering region 202 for forming letters, symbols, or the like (referred to as graphical symbols, hereinafter) which represent manufacturing information such as a manufacturing number or a lot number of the organic EL display unit 201.

FIG. 9 shows a method of forming graphical symbols on the numbering region 202 and corresponds to a cross-sectional view along A—A line in FIG. 8. There is formed on the glass substrate 200 the numbering region 202 made of Cr layer with an insulating film 120 interposed therebetween.

The insulating film 120 and the numbering region 202 are formed by utilizing a part of a manufacturing step of the above-described organic EL display unit 201. For example, the insulating film 120 is formed in a step of forming the gate insulating film 12 of the TFTs 30 and 40, and the numbering region 202 is formed in a step of forming the gate electrodes 31 and 41 of the TFTs 30 and 40.

Graphical symbols are formed on the numbering region 202 by scratching a surface of the numbering region 202 by applying laser beams 300 thereto.

After subsequent manufacturing steps, the organic EL display units 201 are completed forming on the glass substrate 200. The glass substrate 200 is then attached to a sealing substrate (not shown) with a sealing resin interposed between the substrates. Furthermore, the attached glass substrate 200 and sealing substrate are cut off to be divided in into individual organic EL panels.

In the step of forming graphical symbols on the numbering region 202 by the application of the laser beams 300, however, powders substances scattered by the irradiating laser beams adhere to the surface of the glass substrate 200 on which the device elements such as the TFTs and the organic EL elements are formed. This results in failure of the completed EL display device.

SUMMARY OF THE INVENTION

The invention provides a manufacturing method of an electroluminescent display device. The method includes forming an organic electroluminescent display unit on a device substrate, attaching the device substrate having the organic electroluminescent display unit thereon to a sealing substrate using a sealing resin so that the organic electroluminescent display unit is sealed in a space formed by the device substrate, the sealing substrate and the sealing resin, and forming a graphic symbol by applying a laser to a layer disposed on the device substrate after the attaching of the device substrate and the sealing substrate.

The invention also provides another manufacturing method of an electroluminescent display device. The method includes forming an organic electroluminescent display unit on a device substrate, and attaching the device substrate having the organic electroluminescent display unit thereon to a sealing substrate using a sealing resin so that the organic electroluminescent display unit is sealed in a space formed by the device substrate, the sealing substrate and the sealing resin. The method also includes cutting a portion of the sealing substrate attached to the device substrate to expose a portion of the device substrate that is outside the sealed space, and forming a graphic symbol by applying a laser to a layer disposed on the exposed portion of the device substrate.

DETAILED DESCRIPTION OF THE INVENTION

There will be described in detail a manufacturing method of an electroluminescent display device according to an embodiment of the invention with reference to the drawings.

Figure 1:
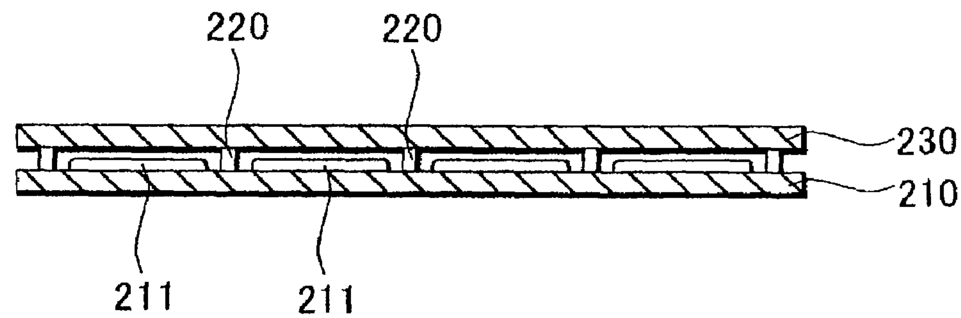
FIG. 1 is a cross-sectional view of a sealed device intermediate according to a first embodiment of the invention.
Figure 6:
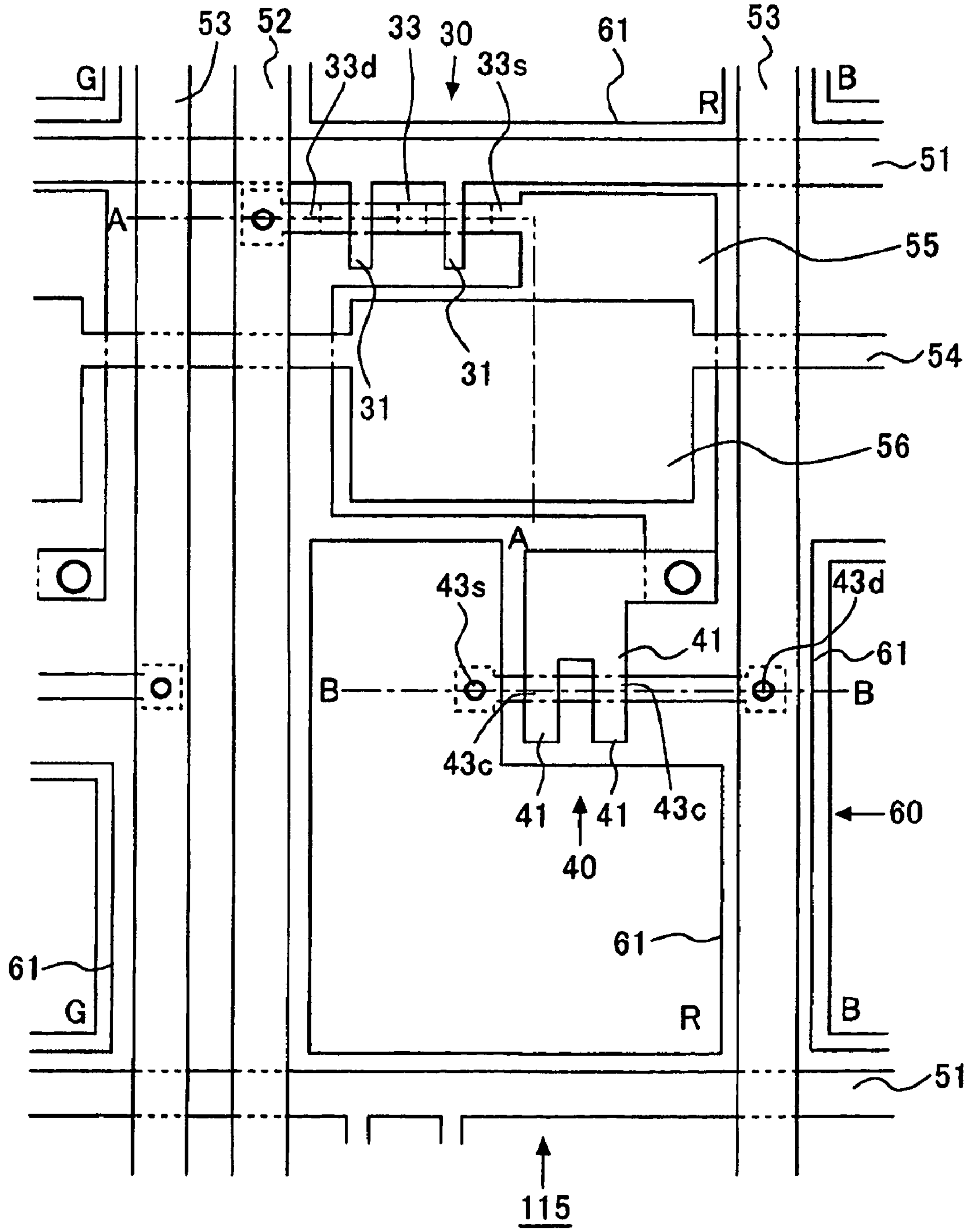
FIG. 6 is a plan view of a pixel of a conventional organic EL display device.
Figure 7A:
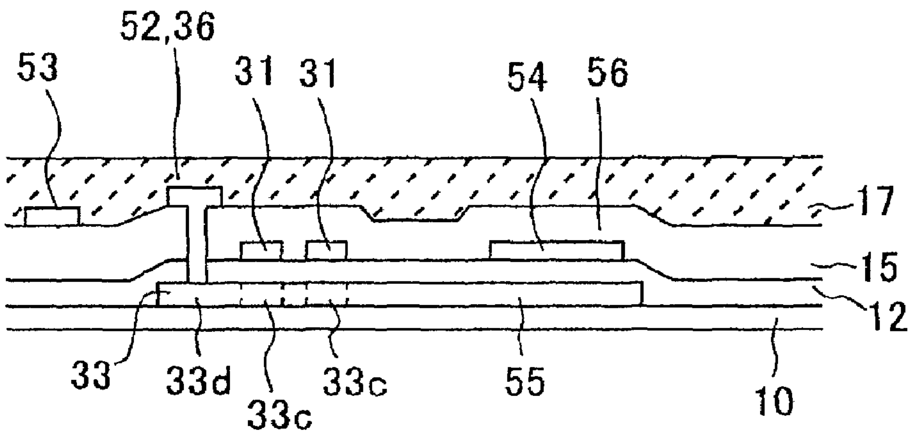
FIGS. 7A and 7B are cross-sectional views of the organic EL display device of FIG. 6.
Figure 7B:
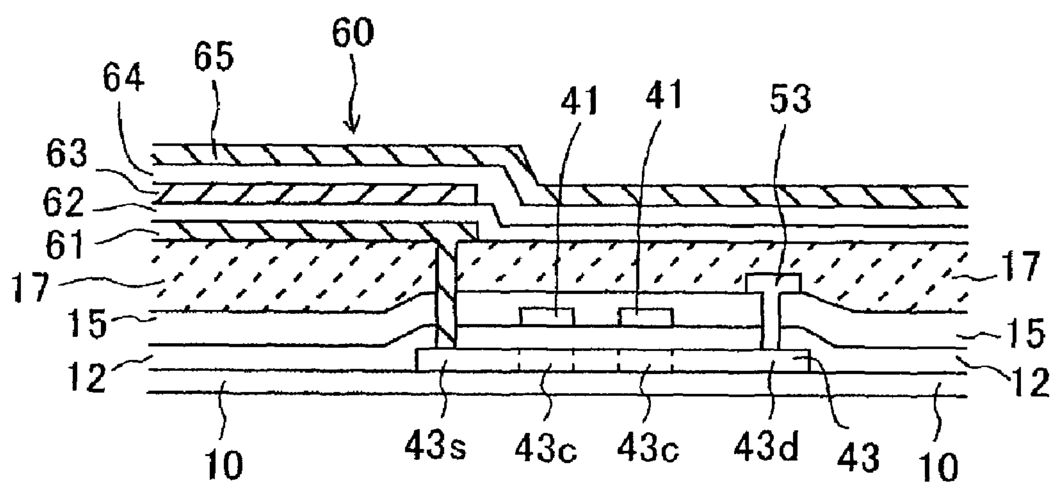
Figure 8:
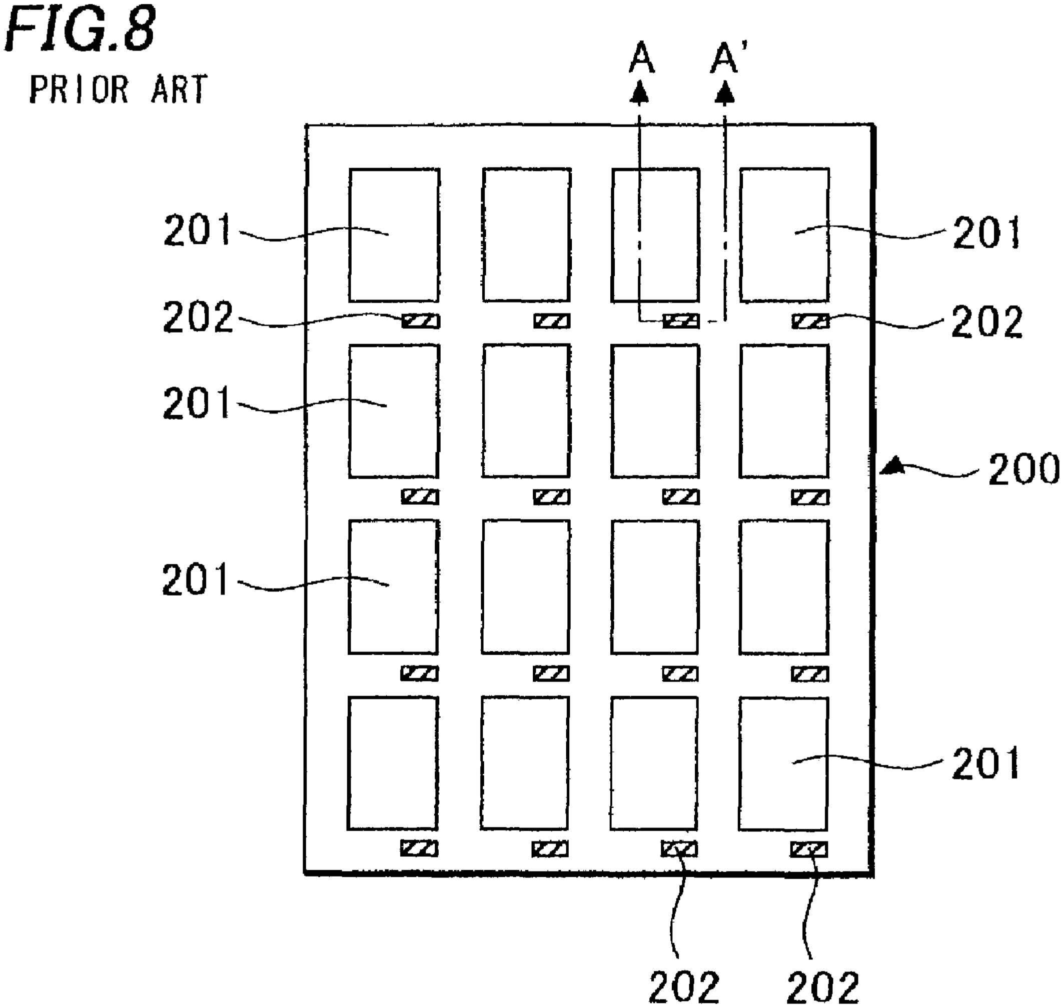
FIG. 8 is a plan view of the organic EL display units of the conventional display device formed on a mother glass substrate.
Figure 9:
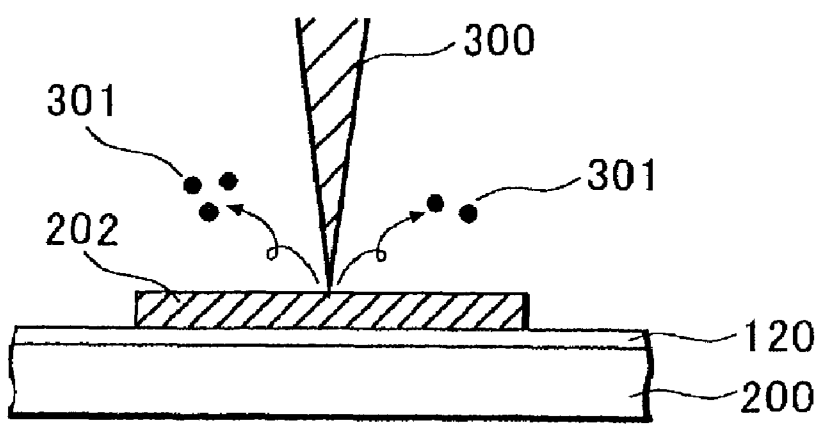
FIG. 9 is a cross-sectional view along line A—A line of FIG. 8 at the time of graphical symbol formation.

FIG. 1 is a cross-sectional view showing a sealed device structure. In FIG. 1, a reference number 210 is a mother glass substrate, which is also referred to as a device substrate. On a surface of the mother glass substrate 210, organic EL panels provided with organic EL display units 211 are formed at predetermined intervals. Each of the organic EL display units 211 formed on the device substrate 210 includes pixels arranged in a matrix configuration, which have the structure shown in FIGS. 6–7B.

This device substrate 210 is attached to a sealing substrate 230 with a sealing resin 220 interposed therebetween. The sealing resin 220 is made of, for example, an epoxy resin, and coated so as to surround the organic EL display units 211.

Figure 2:
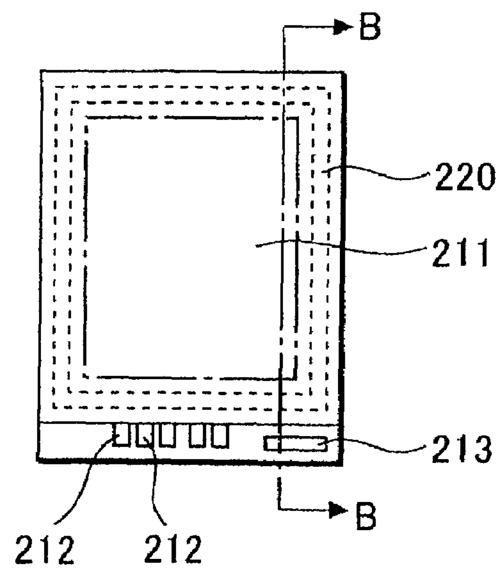
FIG. 2 is a plan view of an organic EL panel cut out from the device intermediate of FIG. 1.
Figure 3:
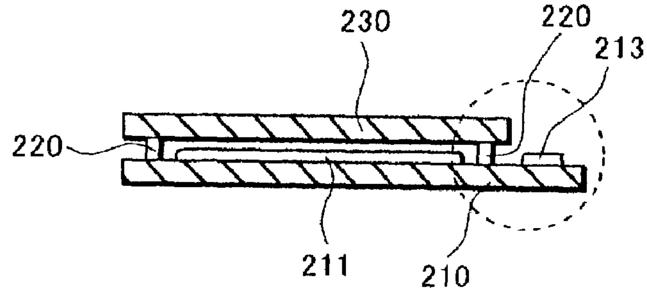
FIG. 3 is a cross-sectional view of the organic EL panel along line B—B of FIG. 2.

Next, the device substrate 210 attached to the sealing substrate 230 is cut to be divided into individual organic EL panels. FIG. 2 is a plane view showing one of such organic EL panels. FIG. 3 is a cross-sectional view along line B—B of FIG. 2.

The divided device substrate 210 is attached to the sealing substrate 230 at its edges with the sealing resin 220. The organic EL display unit 211 is sealed in a space defined by the two substrates and the sealing resin. Then, an edge of the sealing substrate 230 is cut off to expose the corresponding edge of the device substrate 210.

Accordingly, there is formed on the exposed edge of the device substrate 210 a numbering region 213 for forming graphical symbols representing manufacturing information such as a manufacturing number or a lot number of the organic EL display unit 211. Furthermore, the wiring of the organic EL display unit 211 extends to the exposed edge of the device substrate 210, and a plurality of electrodes for outside connection 212 are formed thereon. An FPC (flexible printed circuit) which is not shown is connected to the electrodes for outside connection 212.

Figure 4:
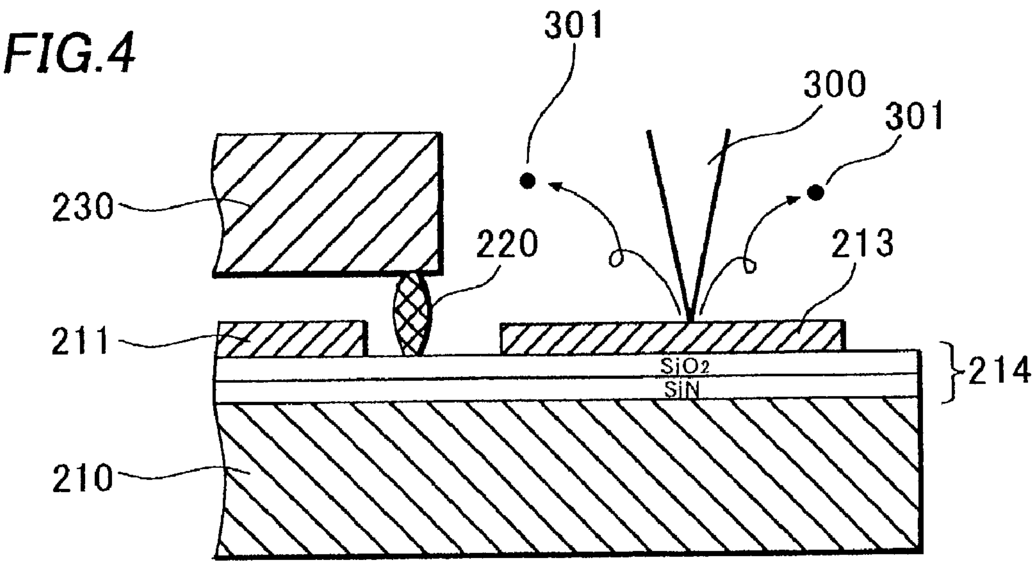
FIG. 4 is a partially expanded sectional view of FIG. 3 at the time of graphical symbol formation.

There will be described a numbering step with reference to FIG. 4 hereafter. FIG. 4 is an enlarged view of a region enclosed by a broken line in FIG. 3. There is formed on a surface of the device substrate 210 an insulating film 214 made of a multi-layer of $SiN_x$ and $SiO_2$, and a numbering region 213 made of Cr (chromium) layer is formed thereon.

The insulating film 214 is formed, for example, in a step of forming a gate insulating film of TFTs of the organic EL display unit 211, and the numbering region 213 is formed in a step of forming gate electrodes of the TFTs.

Graphical symbols are formed on the numbering region 213 by scratching a surface of the numbering region 213 by applying laser beams 300 thereto. The graphical symbols may be, for example, P1X048-06, which represents a manufacturing number. These graphical symbols are selected arbitrarily.

Although powdery substances 301 (such as powders of Cr) are scattered by the application of the laser beams, the organic EL display unit 211 is already sealed and blocked by the sealing resin 220 and the sealing substrate 230 covering the organic EL display unit 211. Therefore, device failure due to the adhesion of the scattered powders to the organic EL display unit 211 is eliminated.

Figure 5:
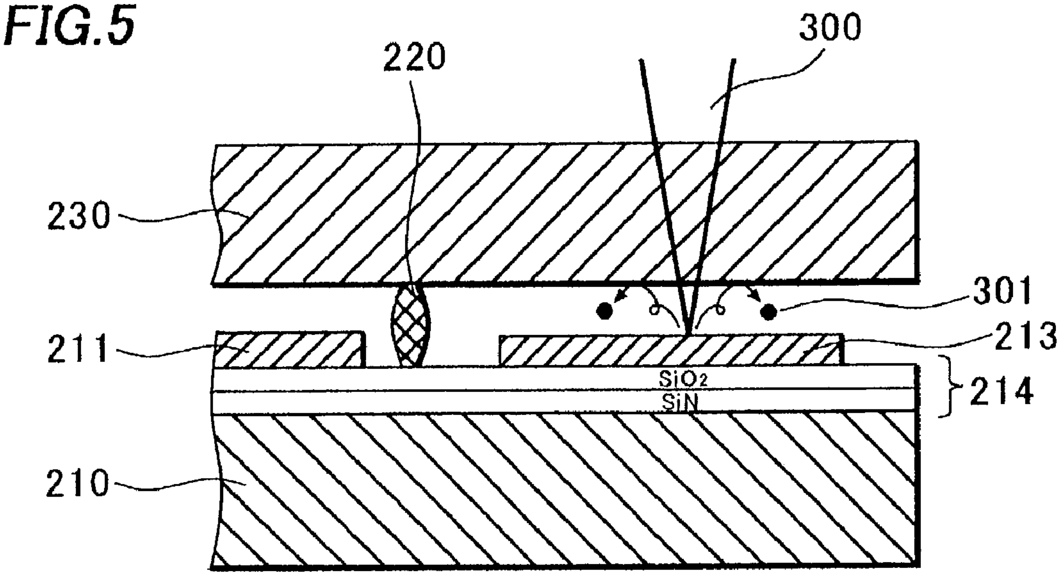
FIG. 5 is a cross-sectional view of an organic EL display device of a second embodiment of the invention at the time of graphical symbol formation.

FIG. 5 is shows a second embodiment of this invention. In the above embodiment, the laser beams are applied to the edge of the device substrate 210 which is exposed by cutting off the edge of the sealing substrate 230. However, the graphical symbols may be formed by applying the laser beams without cutting off the edge of the sealing substrate 230, i.e., with the corresponding edge of the sealing substrate 230 covering the numbering region 213.

The laser beams 300 may be applied to the numbering region 213 through the sealing substrate 230 if the sealing substrate 230 is made of a glass. The powders scattered by the irradiating laser beams are blocked by the sealing resin 220 and the sealing substrate 230 covering the organic EL display unit 211.

Although the gate insulating film 214 of the TFTs is provided below the numbering region 213 in the two embodiments above, any of the suitable layers that are formed during the formation of the organic EL display device may be used to form the numbering region thereon.

What is claimed is:

1. A manufacturing method of an electroluminescent display device, comprising:

forming an organic electroluminescent display unit on a device substrate;

attaching the device substrate having the organic electroluminescent display unit thereon to a sealing substrate using a sealing resin so that the organic electroluminescent display unit is sealed in a space formed by the device substrate, the sealing substrate and the sealing resin; and forming a graphic symbol outside the space in which the organic electroluminescent display unit is sealed by applying a laser to a layer disposed on the device substrate after the attaching of the device substrate and the sealing substrate.

2. A manufacturing method of an electroluminescent display, comprising:

forming an organic electroluminescent display unit on a device substrate;

attaching the device substrate having the organic electroluminescent display unit thereon to a sealing substrate using a sealing resin so that the organic electroluminescent display unit is sealed in a space formed by the device substrate, the sealing substrate and the sealing resin; and forming a graphic symbol outside the space in which the organic electroluminescent display unit is sealed by applying a laser to a layer disposed on the device substrate after the attaching of the device substrate and the sealing substrate, wherein the layer applied with the laser is formed in a step of forming a gate electrode of a thin film transistor that is included in the organic electroluminescent display unit.

3. The manufacturing method of an electroluminescent display device of claim 2, wherein the layer applied with the laser is made of copper or molybdenum.

4. A manufacturing method of an electroluminescent display device, comprising:

forming an organic electroluminescent display unit on a device substrate;

attaching the device substrate having the organic electroluminescent display unit thereon to a sealing substrate using a sealing resin so that the organic electroluminescent display unit is sealed in a space formed by the device substrate, the sealing substrate and the sealing resin;

cutting a portion of the sealing substrate attached to the device substrate to expose a portion of the device substrate that is outside the sealed space; and forming a graphic symbol by applying a laser to a layer disposed on the exposed portion of the device substrate.

5. The manufacturing method of an electroluminescent display device of claim 4, wherein the layer applied with the laser is formed in a step of forming a gate electrode of a thin film transistor that is included in the organic electroluminescent display unit.

6. The manufacturing method of an electroluminescent display device of claim 4, wherein the layer applied with the laser is made of copper or molybdenum.

* * * * *